(12) United States Patent
Wei

(10) Patent No.: US 11,749,374 B1
(45) Date of Patent: Sep. 5, 2023

(54) MEMORY DEVICE

(71) Applicant: Winbond Electronics Corp., Taichung (TW)

(72) Inventor: Tzu-Yin Wei, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/677,951

(22) Filed: Feb. 22, 2022

(51) Int. Cl.
| | | |
|---|---|---|
| *G11C 7/10* | (2006.01) |
| *G11C 29/46* | (2006.01) |
| *G11C 29/12* | (2006.01) |
| *G11C 29/36* | (2006.01) |
| *H03K 19/173* | (2006.01) |
| *H03K 19/20* | (2006.01) |

(52) U.S. Cl.
CPC ............ *G11C 29/46* (2013.01); *G11C 7/1039* (2013.01); *G11C 29/1201* (2013.01); *G11C 29/36* (2013.01); *H03K 19/1737* (2013.01); *H03K 19/20* (2013.01); *G11C 2029/3602* (2013.01)

(58) Field of Classification Search
CPC ... G11C 29/46; G11C 7/1039; G11C 29/1201; G11C 29/36; G11C 2029/3602; H03K 19/1737; H03K 19/20
See application file for complete search history.

(56) References Cited

U.S. PATENT DOCUMENTS

| | | | | |
|---|---|---|---|---|
| 7,522,073 | B1 * | 4/2009 | Kao | ...................... H03M 5/145 |
| | | | | 710/110 |
| 8,984,354 | B2 | 3/2015 | Kuo et al. | |
| 2007/0115733 | A1 | 5/2007 | Jang et al. | |
| 2017/0075854 | A1 * | 3/2017 | Hollis | ................. G06F 13/4286 |

FOREIGN PATENT DOCUMENTS

TW 202139201 10/2021

OTHER PUBLICATIONS

"Office Action of Taiwan Counterpart Application", dated Dec. 30, 2022, p. 1-p. 8.

* cited by examiner

*Primary Examiner* — Mohammed A Bashar
(74) *Attorney, Agent, or Firm* — JCIPRNET

(57) ABSTRACT

A memory device includes a memory cell array, a data accessing circuit, a data bus inversion calculator, a multiplexer, and an output result judging circuit. The data accessing circuit performs a data write-in operation or a data read-out operation on the memory cell array. The data accessing circuit reads read-out data from the memory cell array. The data bus inversion calculator generates inversion indication data according to the read-out data. The multiplexer outputs the inversion indication data or test data according to a mode signal. The output result judging circuit compares the read-out data with the inversion indication data or the test data to generate output information.

11 Claims, 3 Drawing Sheets

MEMORY DEVICE

BACKGROUND

Technology Field

The disclosure relates to a memory device, and particularly, to a memory device with built-in self-test (BIST) function.

Description of Related Art

In a memory device, a data bus inversion (DBI) mechanism is often configured to reduce the need for data inversion in the bus, thereby reducing power consumption and noise on the bus. On the other hand, in the memory device, it is a necessary requirement to configure the built-in self-test function.

Under the premise, in a conventional memory device, the configuration of a hardware circuit for data inversion in response to the data bus inversion mechanism and the configuration of related circuits with a built-in self-test function for error bit detection are required. Therefore, a certain number of circuits are required on the data read-out path in the conventional memory device. In addition to consuming the circuit layout area, excess power is consumed and an excessive load on the data read-out path is generated, which reduces the data readout performance of the memory device.

SUMMARY

The disclosure provides a memory device capable of simplifying the circuit required in the built-in self-test function.

A memory device of the disclosure includes a memory cell array, a data accessing circuit, a data bus inversion calculator, a multiplexer, and an output result judging circuit. The data accessing circuit is coupled to the memory cell array and performs a data write-in operation or a data read-out operation on the memory cell array. The data read-out operation reads read-out data from the memory cell array. A data bus inversion calculator is coupled to the data accessing circuit and configured for receiving the read-out data to generate inversion indication data according to the read-out data. The multiplexer receives the inversion indication data and test data to output the inversion indication data or the test data according to a mode signal. The output result judging circuit is coupled to the multiplexer and allows the read-out data and the inversion indication data or the test data to perform operations to generate output information.

In summary, the memory device of the disclosure outputs the inversion indication data or the test data to the output result judging circuit through the multiplexer in different operation modes. The output result judging circuit can correspond to different operation modes to generate the final read-out data or error bit information. Accordingly, without configuring redundant judging circuits for test results in the memory device of the disclosure for the built-in self-test function, the load of the write-in path in the memory device is effectively reduced and the area required for circuit layout is reduced.

DESCRIPTION OF THE EMBODIMENTS

Figure 1:
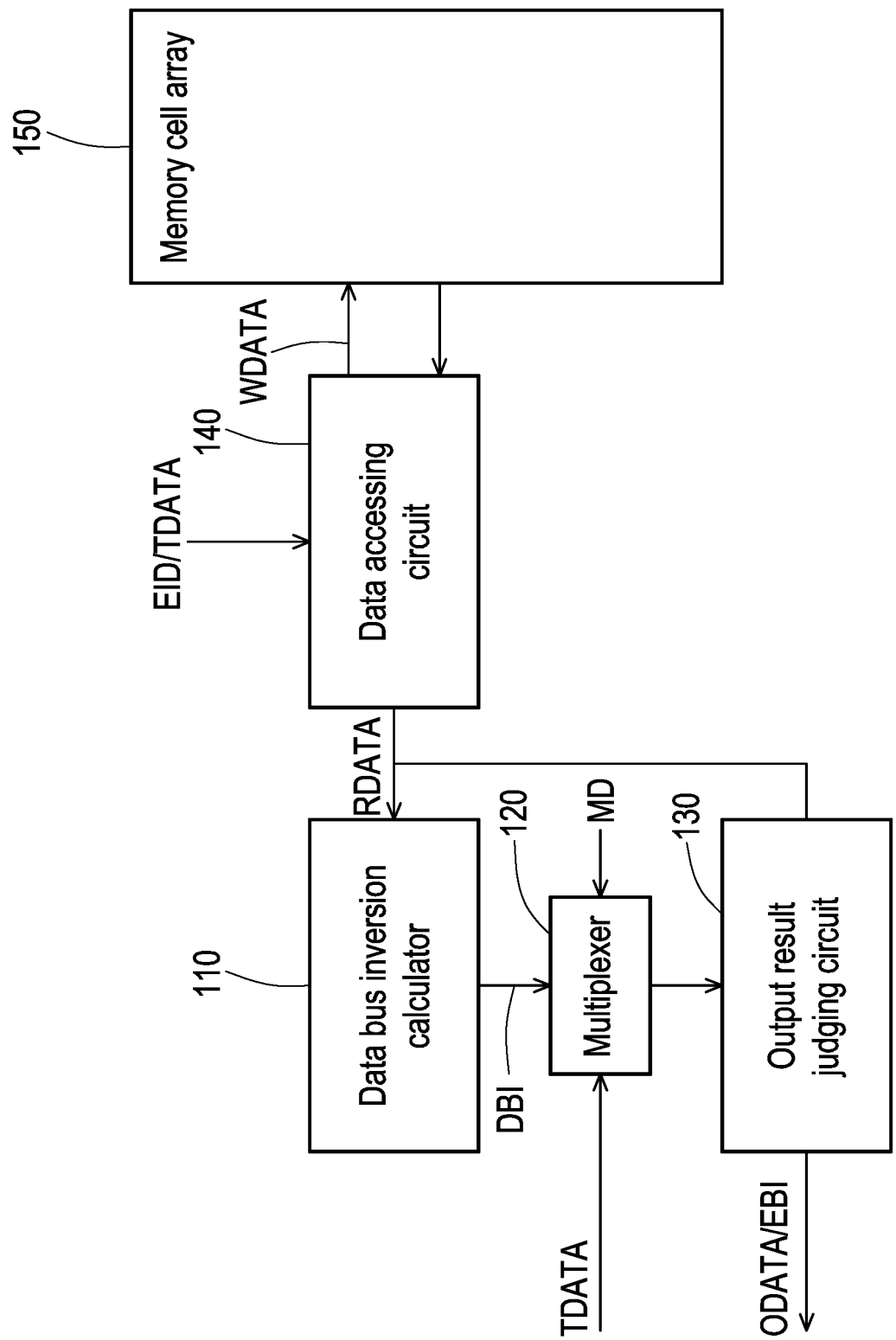
FIG. 1 is a schematic view of a memory device according to an embodiment of the disclosure.

Referring to FIG. 1, a memory device 100 includes a data bus inversion calculator 110, a multiplexer 120, an output result judging circuit 130, a data accessing circuit 140, and a memory cell array 150. The data accessing circuit 140 is coupled to the memory cell array 150. The data accessing circuit 140 is configured for performing a data write-in operation according to write-in data WDATA for the memory cell array 150. Alternatively, the data accessing circuit 140 may perform a data read-out operation on the memory cell array 150 to obtain read-out data RDATA.

In detail, when the data accessing circuit 140 performs the data write-in operation, the write-in data WDATA may be generated according to test data TDATA or external input data EID, and the write-in data WDATA is written to one or multiple selected memory cells in the memory cell array 150. The data accessing circuit 140 selects the external input data EID to perform the data write-in operation in the normal mode. In the test mode, the data accessing circuit 140 selects the test data TDATA to perform the data write-in operation.

In addition, when the data accessing circuit 140 performs the data read-out operation, the read-out data RDATA can be obtained by detecting the signals on the bit lines of one or multiple selected memory cells in the memory cell array 150.

The data bus inversion calculator 110 is coupled to the data accessing circuit 140. In the normal mode, when the data read-out operation is performed, the data bus inversion calculator 110 can receive the read-out data RDATA and calculate the quantity of bits of the first logic value among the multiple bits of the read-out data RDATA. The data bus inversion calculator 110 generates enabled inversion indication data DBI when the quantity of bits of the read-out data RDATA whose bits are the first logic value is greater than the preset reference value. The first logical value may be a logical value of 0 or may also be a logical value of 1. The preset reference value may be half of the total number of bits of the read-out data RDATA.

The multiplexer 120 is coupled between the data bus inversion calculator 110 and the output result judging circuit 130. The multiplexer 120 can receive the test data TDATA and the inversion indication data DBI generated by the data bus inversion calculator 110. The multiplexer 120 can output the inversion indication data DBI or the test data TDATA to the output result judging circuit 130 according to a mode signal MD. When the mode signal MD indicates that the memory device 100 operates in the normal mode, the multiplexer 120 can output the inversion indication data DBI to the output result judging circuit 130. On the other hand, when the mode signal MD indicates that the memory device 100 operates in the test mode, the multiplexer 120 can output the test data TDATA to the output result judging circuit 130.

The output result judging circuit 130 is further coupled to the data accessing circuit 140. The output result judging circuit 130 receives the inversion indication data DBI or the test data TDATA provided by the multiplexer 120 and receives the read-out data RDATA provided by the data accessing circuit 140. The output result judging circuit 130 is configured for performing operations on the read-out data RDATA and the inversion indication data DBI or performing operations on the read-out data RDATA and the test data TDATA, thereby generating output information. In the normal mode, the output result judging circuit 130 is configured for performing an XNOR operation on the read-out data RDATA and the inversion indication data DBI and generating output information for final read-out data ODATA. In the test mode, the output result judging circuit 130 is configured to perform an XNOR operation on the read-out data RDATA and the test data TDATA and generate output information as error bit information EBI.

In terms of the overall operation details of the memory device 100, in the normal mode, when the data write-in operation is performed, the data accessing circuit 140 can generate the write-in data WDATA according to the received external input data EID, and the write-in data WDATA is written into the memory cell array 150. Note that the data accessing circuit 140 can pre-determine multiple bits of the external input data EID and generate the write-in data WDATA accordingly. For example, when the external input data EID has more bits with logic value 1 than bits with logic value 0, the data accessing circuit 140 can invert the external input data EID to generate the write-in data WDATA. When the external input data EID has fewer bits with logic value 1 than bits with logic value 0, the data accessing circuit 140 can make the external input data EID equal to the write-in data WDATA. The action is called a data bus inversion (DBI) mechanism, which is used to improve the data writing efficiency of the memory and reduce power consumption.

In the data read-out operation in the normal mode, the data accessing circuit 140 reads the read-out data RDATA from the memory cell array 150. The read-out data RDATA is sent to the data bus inversion calculator 110. The data bus inversion calculator 110 can generate inversion indication data DBI corresponding to the read-out data RDATA.

Next, in the normal mode, the read-out data RDATA and the corresponding inversion indication data DBI can be sent to the output result judging circuit 130. The output result judging circuit 130 can generate the final read-out data ODATA according to the applied XNOR operation. In the example, when the inversion indication data DBI is the logic value 0, it means that there are more bits with the logic value 0 in the read-out data RDATA and it requires to perform an inversion. Therefore, the output result judging circuit 130 can perform an XNOR operation on the inversion indication data DBI and the read-out data RDATA and invert the read-out data RDATA to generate the final read-out data ODATA.

On the other hand, in the test mode, when the data write-in operation is performed, the data accessing circuit 140 can generate the write-in data WDATA according to the received test data TDATA, and the write-in data WDATA is written into the memory cell array 150. In the data read-out operation, the data accessing circuit 140 reads the read-out data RDATA from the memory cell array 150. The read-out data RDATA is sent to the output result judging circuit 130. Meanwhile, the data bus inversion calculator 110 stops working. The multiplexer 120 transmits the test data TDATA to the output result judging circuit 130 according to the mode signal MD.

The output result judging circuit 130 can compare the test data TDATA and the read-out data RDATA to generate a test result and judge the error bit information EBI in the read-out data RDATA. Note that the output result judging circuit 130 can also compare the test data TDATA and the read-out data RDATA by applying the XNOR operation. The user only needs to perform a reverse interpretation of the error bit information EBI and can acquire which bits in the read-out data RDATA are error bits.

According to the foregoing description, whether the output result judging circuit 130 is in the normal mode or in the test mode, the same XNOR operation is applied to generate the final read-out data ODATA or the error bit information EBI. That is, in the output result judging circuit 130, there is no need to configure different hardware circuits in the normal mode and in the test mode, which can effectively minimize the requirements of hardware disposed on the data read-out path in the memory device 100, effectively reduce the load on the data read-out path, and improve the data access performance of the memory device 100.

Figure 2:
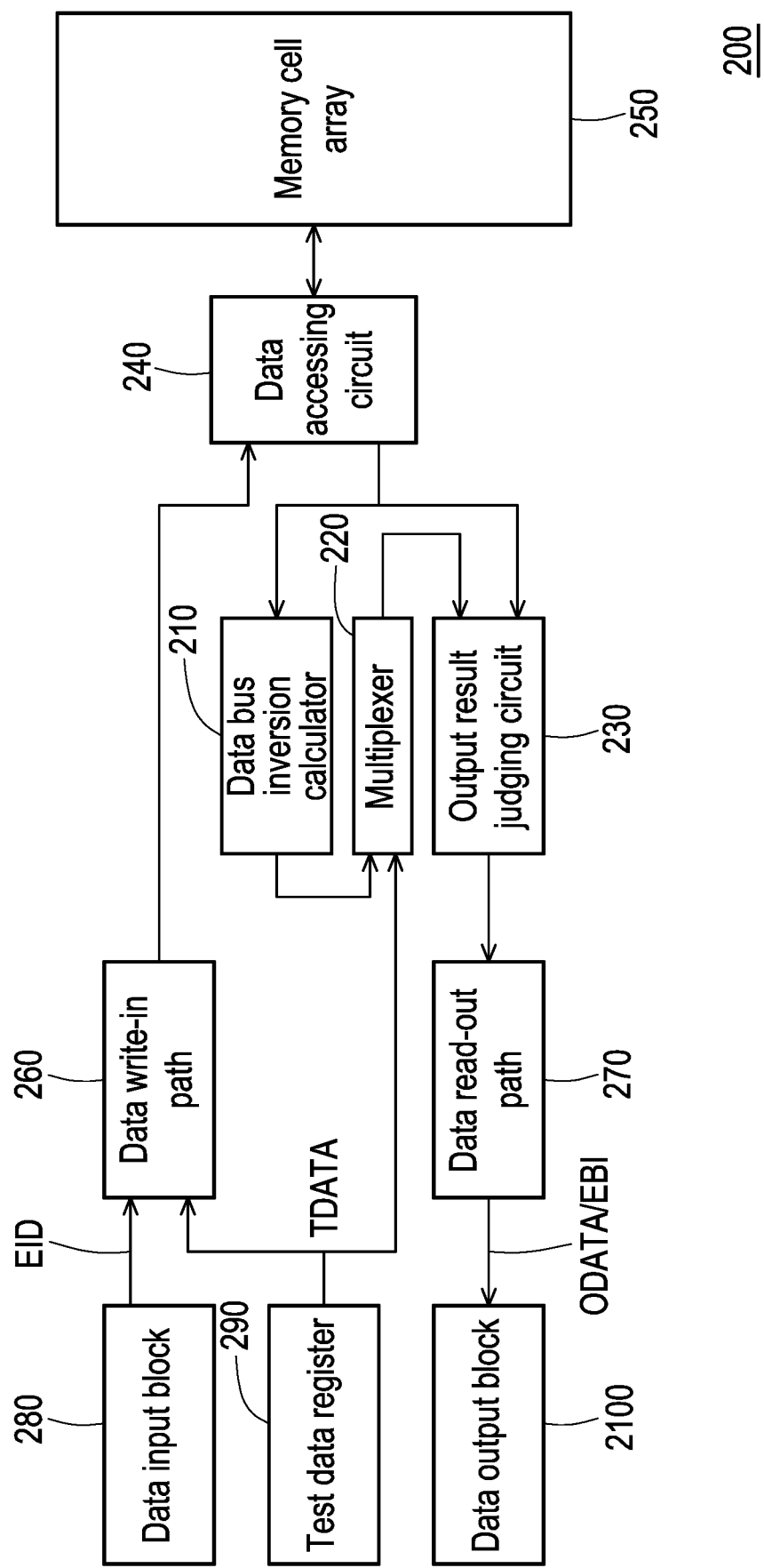
FIG. 2 is a block diagram of a memory device according to another embodiment of the disclosure.

Referring to FIG. 2, a memory device 200 includes a data bus inversion calculator 210, a multiplexer 220, an output result judging circuit 230, a data accessing circuit 240, a memory cell array 250, a data input block 280, a data output block 2100, and a test data temporary register 290. The data input block 280 is coupled to the data accessing circuit 240 through the data write-in path 260 and configured to provide the external input data EID. The output result judging circuit 230 is coupled to the data output block 2100 through the data read-out path 270. The data output block 2100 is configured for outputting the final read-out data ODATA or error bit information EBI. The test data register 290 is coupled to the data write-in path 260 and the multiplexer 220 and configured for providing the test data TDATA.

In the embodiment, the test data register 290 is configured to store the relevant test data TDATA for executing the built-in self-test (BIST) action. When the built-in self-test mode is activated, the test data TDATA is provided to the memory cell array 250 to perform a test operation on the memory cell array 250 and its peripheral circuits.

The details of the operations of the data bus inversion calculator 210, the multiplexer 220, the output result judging circuit 230, and the data accessing circuit 240 have been illustrated in detail in the foregoing embodiments and are not be repeated herein.

Regarding the hardware architecture, the memory cell array 250 may be a memory cell array implemented by a dynamic random access memory. The data bus inversion calculator 210 may be implemented by digital circuits and have no specific circuit structure. The data input block 280 and the data read-out path 270 may include one or more buffers and switches, which may be implemented as input interface circuits and output interface circuits known to those skilled in the art. The multiplexer 220 may be implemented using multiplexer circuits well known to those skilled in the art, which is not specifically limited.

For the hardware structure of the output result judging circuit 230 and the data accessing circuit 240, refer to the embodiments in FIG. 3 and FIG. 4 as follows.

Figure 3:
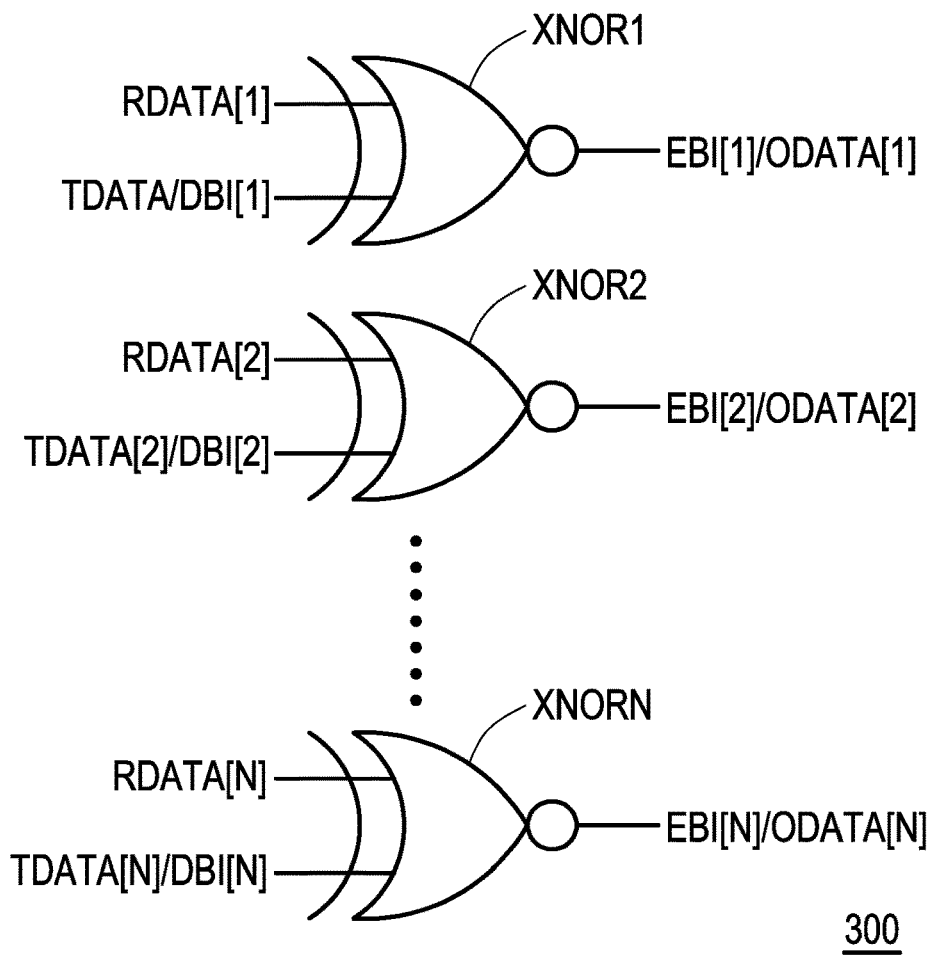
FIG. 3 is a schematic view illustrating an implementation of an output result judging circuit in a memory device according to an embodiment of the disclosure.

Referring to FIG. 3, an output result judging circuit 300 includes multiple XNOR gates XNOR1-XNORN. The first terminals of the XNOR gates XNOR1-XNORN each receive multiple bits RDATA[1]-RDATA[N] of the read-out data, the second terminals of the XNOR gates XNOR1-XNORN each receive multiple bits TDATA[1]-TDATA[N] of test data or multiple bits DBI[1]-DBI[N] of inversion indication data. The XNOR gates XNOR1-XNORN generate multiple bits EBI[1]-EBI[N] of error bit information, respectively or generate multiple bits ODATA[1]-ODATA[N] of the final read-out data, respectively.

Figure 4:
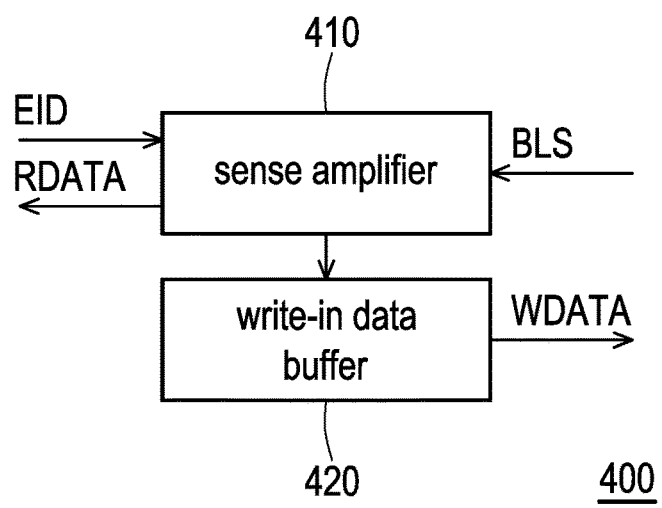
FIG. 4 is a schematic view illustrating an implementation of a data accessing circuit in a memory device according to an embodiment of the disclosure.

Referring to FIG. 4, the data accessing circuit 400 includes a sense amplifier 410 and a write-in data buffer 420. The sense amplifier 410 can receive the external input data EID and convert the external input data EID into the write-in data WDATA. The write-in data WDATA can be temporarily stored in the write-in data buffer 420 and provided by the write-in data buffer 420 to the memory cell array for data writing.

The sense amplifier 410 can also detect a bit line signal BLS on the memory cell array to obtain the read-out data RDATA.

In the embodiment, the sense amplifier 410 can be implemented by using any form of sense amplifier circuit known to those skilled in the art, and there is no specific limitation. The write-in data buffer 420 can be a page buffer commonly used in memory devices and also has no specific limitation.

In summary, with the output result judging circuit configured in the memory device of the disclosure and the same hardware circuit, the data bit inversion operation and the test operation can be performed respectively in different modes. Accordingly, the quantity of circuits on the data output path of the memory device of the disclosure can be reduced, and the load on the data output path is simultaneously reduced, thereby improving the efficiency of the data readout operation of the memory device.

What is claimed is:

1. A memory device comprising:
    a memory cell array;
    a data accessing circuit, coupled to the memory cell array and performing a data read-out operation on the memory cell array, wherein the data read-out operation reads read-out data from the memory cell array;
    a data bus inversion calculator, coupled to the data accessing circuit and configured for receiving the read-out data to generate inversion indication data according to the read-out data;
    a multiplexer, receiving the inversion indication data and test data to output the inversion indication data or the test data according to a mode signal; and
    an output result judging circuit, coupled to the multiplexer and allowing the read-out data and the inversion indication data or the test data to perform operations to generate output information.

2. The memory device of claim 1, wherein the mode signal is configured to instruct which mode the memory device operates in: a normal mode or a test mode.

3. The memory device of claim 2, wherein the multiplexer selects to output the test data to the output result judging circuit when the memory device operates in the test mode, and the multiplexer selects to output the inversion indication data to the output result judging circuit when the memory device operates in the normal mode.

4. The memory device of claim 2, wherein in the normal mode, the output result judging circuit allows a plurality of bits of the read-out data and a plurality of bits of the inversion indication data to perform an XNOR operation respectively, so as to generate final read-out data of the output information; in the test mode, the output result judging circuit allows the bits of the read-out data and a plurality of bits of the test data to perform the XNOR operation respectively, so as to generate the output information of error bit information, respectively.

5. The memory device of claim 2, wherein in the test mode, the data bus inversion calculator stops working.

6. The memory device of claim 1, wherein the output result judging circuit comprises a plurality of XNOR gates, each bit of the read-out data is received at a first input terminal of each of the XNOR gates, each bit of the test data or each bit of the inversion indication data is received at the second input terminal of each of the XNOR gates, and each bit of the output information is generated at an output terminal of each of the XNOR gates.

7. The memory device of claim 1, further comprising:
    a test data register, coupled to the multiplexer and configured for storing the test data.

8. The memory device of claim 7, further comprising:
    a data input block, coupled to the data accessing circuit and configured for providing external input data to the data accessing circuit; and
    a data output block, coupled to the output result judging circuit and configured for outputting the output information.

9. The memory device of claim 8, wherein there is a data write-in path between the data input block and the data accessing circuit, and there is a data read-out path between the data output block and the output result judging circuit path.

10. The memory device of claim 8, wherein the data accessing circuit comprises:
    a sense amplifier, configured for providing write-in data to the memory cell array or detecting the read-out data from the memory cell array; and
    a write-in data buffer, coupled to the sense amplifier and configured for temporarily storing the write-in data.

11. The memory device of claim 1, wherein the data bus inversion calculator calculates a quantity of bits of the read-out data that are a first logic value, and enabled inversion indication data is generated when the quantity is greater than a preset reference.

* * * * *